United States Patent
Tanigaki

(10) Patent No.: US 11,569,169 B2
(45) Date of Patent: Jan. 31, 2023

(54) SEMICONDUCTOR DEVICE COMPRISING ELECTRONIC COMPONENTS ELECTRICALLY JOINED TO EACH OTHER VIA METAL NANOPARTICLE SINTERED LAYER AND METHOD OF MANUFACTURING THE SAME

(71) Applicant: MITSUBISHI ELECTRIC CORPORATION, Chiyoda-ku (JP)

(72) Inventor: Tsuyoshi Tanigaki, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 120 days.

(21) Appl. No.: 16/485,552

(22) PCT Filed: Jan. 31, 2018

(86) PCT No.: PCT/JP2018/003163
§ 371 (c)(1),
(2) Date: Aug. 13, 2019

(87) PCT Pub. No.: WO2018/173493
PCT Pub. Date: Sep. 27, 2018

(65) Prior Publication Data
US 2020/0006243 A1    Jan. 2, 2020

(30) Foreign Application Priority Data

Mar. 24, 2017  (JP) .............. JP2017-059464

(51) Int. Cl.
*H01L 23/532* (2006.01)
*H01L 21/768* (2006.01)
(Continued)

(52) U.S. Cl.
CPC ...... *H01L 23/53252* (2013.01); *H01L 21/477* (2013.01); *H01L 21/76841* (2013.01);
(Continued)

(58) Field of Classification Search
CPC ......... H01L 23/53252; H01L 23/53238; H01L 23/528; H01L 23/53266; H01L 21/76841; H01L 21/477; H01L 24/83; H01L 24/32
(Continued)

(56) References Cited

U.S. PATENT DOCUMENTS

| 2009/0025967 A1 | 1/2009 | Boureghda et al. |
| 2018/0269074 A1* | 9/2018 | Kamikoriyama ....... H01L 24/32 |
| 2019/0355690 A1* | 11/2019 | Nakako ................... H01L 24/83 |

FOREIGN PATENT DOCUMENTS

| JP | 2010050189 A  *  3/2010 ............. H01L 23/12 |
| JP | 2012-124497 A    6/2012 |

(Continued)

OTHER PUBLICATIONS

International Search Report dated Apr. 17, 2018 in PCT/JP2018/003163 filed on Jan. 31, 2018.
(Continued)

*Primary Examiner* — Hoai V Pham
(74) *Attorney, Agent, or Firm* — Xsensus LLP

(57) ABSTRACT

Provided is a semiconductor device including electronic components electrically joined to each other via a metal nanoparticle sintered layer, wherein the metal nanoparticle sintered layer has formed therein a metal diffusion region in which a metal constituting a metallization layer formed on a surface of one of the electronic components is diffused, and in which the metal is present in an amount of 10 mass % or more and less than 100 mass % according to TEM-EDS analysis, and wherein the metal diffusion region has a thickness smaller than a thickness of the metallization layer.

4 Claims, 5 Drawing Sheets

(51) Int. Cl.
   *H01L 23/528* (2006.01)
   *H01L 21/477* (2006.01)

(52) U.S. Cl.
   CPC ...... *H01L 23/528* (2013.01); *H01L 23/53238* (2013.01); *H01L 23/53266* (2013.01)

(58) Field of Classification Search
   USPC .......................................................... 257/751
   See application file for complete search history.

(56) References Cited

FOREIGN PATENT DOCUMENTS

| | | |
|---|---|---|
| JP | 2013-91835 A | 5/2013 |
| JP | 2015-103791 A | 6/2015 |
| JP | 2016-32051 A | 3/2016 |
| JP | 2017-101264 A | 6/2017 |
| JP | 2017-155166 A | 9/2017 |
| WO | 2013/125022 A1 | 8/2013 |
| WO | WO 2014/002949 A1 | 1/2014 |
| WO | 2015/029152 A1 | 3/2015 |
| WO | WO 2016/088554 A1 | 6/2016 |
| WO | WO-2018168185 A1 * | 9/2018 ............. H01L 25/07 |

OTHER PUBLICATIONS

Hirose Akio, "A Novel Bonding Process Using Ag Nanoparticles—Application to Electronics Assembly as Alternative to Microsoldering Using Lead-Rich Solders-", Journal of The Japan Welding Society, vol. 76, 2007, pp. 162-166.

Kim S. Siow, "Mechanical Properties of Nano-Silver Joints as Die Attach Materials", Journal of Alloys and Compounds, 514, 2012, pp. 6-19.

Masami Nakamoto, "Preparation of Metal Nanoparticles and its Application to Conductive Pastes", Journal of Japan nstitute of Electronics Packaging, vol. 11, No. 1, 2008.

Office Action dated Sep. 15, 2022, in corresponding Chinese patent Application No. 201880018674.0, 10 pages.

* cited by examiner

SEMICONDUCTOR DEVICE COMPRISING ELECTRONIC COMPONENTS ELECTRICALLY JOINED TO EACH OTHER VIA METAL NANOPARTICLE SINTERED LAYER AND METHOD OF MANUFACTURING THE SAME

TECHNICAL FIELD

The present invention relates to a semiconductor device and a method of manufacturing the same.

BACKGROUND ART

In recent years, there has been developed a semiconductor device using a semiconductor element made of, for example, silicon carbide (SiC) or gallium nitride (GaN), which is capable of being operated at high temperature. In such semiconductor device, it is required that electronic components, for example, a semiconductor element and a circuit board be joined to each other with a high joint strength. As a technology for forming a joint portion excellent in joint strength, there has been known a method of joining electronic components to each other by heating and pressurizing through use of a metal nanoparticle joint material.

For example, in Patent Document 1, there is disclosed a method of manufacturing a semiconductor module, the method including the steps of: applying a paste containing silver-based metal powder having two peaks in a particle size distribution and a solvent to a surface of a conductor layer of a wiring board having the conductor layer on a surface of a base material, to thereby form a paste layer; drying the solvent of the paste layer to form a retention layer for the silver-based metal powder on the wiring board; heating the wiring board having the retention layer to join particles of the silver-based metal powder constituting the retention layer to each other, to thereby form a silver porous body layer in which open cells are dispersed; impregnating the silver porous body layer with an organic silver complex solution to form an organic silver complex-impregnated silver porous body layer; and placing a semiconductor element on the organic silver complex-impregnated silver porous body layer, and heating the wiring board having the organic silver complex-impregnated silver porous body layer to reduce the organic silver complex solution, to thereby form a joint layer.

In Patent Document 2, there is disclosed a method of manufacturing an electronic component having a joint layer configured to electrically connect two electrodes, the method including a step of applying a joint material containing cupric oxide, a hydrate of a copper salt, and a solvent to a part to be joined on a surface of an electrode made of pure gold or a gold alloy, and thermally decomposing the hydrate of a copper salt by heating, to thereby reduce the cupric oxide.

In Patent Document 3, there is disclosed a method of manufacturing a semiconductor device, the method including: placing a joint material between electronic components to be joined to each other, the joint material containing Ag nanoparticles each having a particle surface coated with an organic substance and metal X nanoparticles each having a particle surface coated with an organic substance and having a hardness higher than that of Ag; and subjecting the joint material to heat treatment to sinter the Ag nanoparticles and the metal X nanoparticles, to thereby form a joint layer in which the metal X is dispersed in a Ag matrix.

Further, as described in Patent Document 2 and Patent Document 3, in this technical field, it has been considered to be desired that a metal diffusion region be actively formed in the vicinity of a joint interface in order to join the electronic components to each other with a higher joint strength.

CITATION LIST

Patent Document

Patent Document 1: WO 2014/002949
Patent Document 2: Japanese Patent Application Laid-Open No. 2016-32051
Patent Document 3: Japanese Patent Application Laid-Open No. 2012-124497

SUMMARY OF INVENTION

Technical Problem

However, the joint layer in which the metal nanoparticles are sintered is brittle as compared to a pure metal. Therefore, the joint layer cannot withstand repeated thermal shock, and cracks are generated in a vertical direction so as to stride across the electronic components. The cracks in the vertical direction do not have a significant effect on the conductivity and heat radiation property of a semiconductor device. However, it has been found that, when thermal shock is further applied to the joint interface, the propagation of cracks in a horizontal direction (plane direction) is caused in the metal diffusion region in the vicinity of the joint interface. The cracks in the horizontal direction rupture a region between the electronic components, and hence the cracks have a problem of deteriorating the conductivity and heat radiation property of the semiconductor device.

Accordingly, the present invention has been made to solve the above-mentioned problems, and an object of the present invention is to provide a semiconductor device having such high joint reliability that the propagation of cracks in the horizontal direction can be suppressed even when repeated thermal shock is applied to the semiconductor device.

Another object of the present invention is to provide a method of manufacturing a semiconductor device having high joint reliability.

Solution to Problem

The inventor of the present invention has made extensive investigations to solve the above-mentioned problems, and as a result, has found that the propagation of cracks in the horizontal direction can be suppressed by setting the thickness of a metal diffusion region, which is formed when a metal constituting a metallization layer formed on a surface of an electronic component is diffused into a metal nanoparticle sintered layer, to be smaller than the thickness of the metallization layer, to thereby achieve the present invention.

That is, according to one embodiment of the present invention, there is provided a semiconductor device, including electronic components electrically joined to each other via a metal nanoparticle sintered layer, wherein the metal nanoparticle sintered layer has formed therein a metal diffusion region in which a metal constituting a metallization layer formed on a surface of one of the electronic components is diffused, and in which the metal is present in an amount of 10 mass % or more and less than 100 mass % according to TEM-EDS analysis, and wherein the metal diffusion region has a thickness smaller than a thickness of the metallization layer. As used herein, the "electronic component" refers to, for example, a semiconductor element, a circuit board, a lead frame, and a heat radiation member constituting the semiconductor device.

According to another embodiment of the present invention, there is provided a method of manufacturing a semiconductor device including electrically joining electronic components to each other via a metal nanoparticle sintered layer, the method including a step of subjecting a metallization layer formed on a surface of one of the electronic components to oxygen plasma treatment or nitrogen plasma treatment and then performing the joining by heating and pressurizing to diffuse a metal constituting the metallization layer into the metal nanoparticle sintered layer, to thereby form a metal diffusion region having a thickness smaller than a thickness of the metallization layer.

Advantageous Effects of Invention

According to the present invention, the semiconductor device having such high joint reliability that the propagation of cracks in the horizontal direction can be suppressed even when repeated thermal shock is applied to the semiconductor device can be provided. In addition, according to the present invention, the method of manufacturing a semiconductor device having high joint reliability can be provided.

DESCRIPTION OF EMBODIMENTS

First Embodiment

Figure 1:
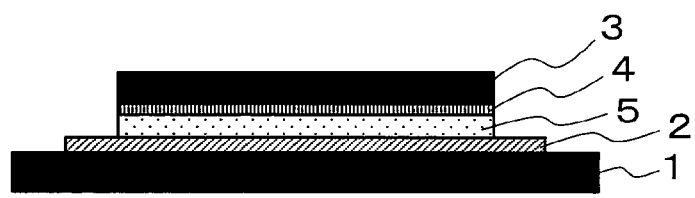
FIG. 1 is a schematic sectional view of a semiconductor device according to a first embodiment of the present invention.

FIG. 1 is a schematic sectional view of a semiconductor device according to a first embodiment of the present invention. As illustrated in FIG. 1, in the semiconductor device according to the first embodiment, a metal electrode 2 formed on a surface of a circuit board 1 and a metallization layer 4 formed on a surface of a semiconductor element 3 are electrically joined to each other via a metal nanoparticle sintered layer 5.

A material for the circuit board 1 is not particularly limited as long as the material is generally used for a circuit board of a semiconductor device. Examples thereof include silicon nitride ($Si_3N_4$), aluminum nitride (AlN), and a copper molybdenum alloy.

The metal electrode 2 is not particularly limited as long as the metal electrode 2 is an electrode that is generally used as an electrode of a semiconductor device, and the metal electrode 2 may be made of, for example, Cu, Ni, or an alloy containing any of these metals as a main component. In addition, the metal electrode 2 may be obtained by forming a Cu film or a Ni film on a surface of a metal other than Cu and Ni by a method such as plating or sputtering. It is required that the metal electrode 2 have a sufficiently large thickness as compared to the thickness of the metal nanoparticle sintered layer 5 (specifically, a thickness that is five times or more as large as the thickness of the metal nanoparticle sintered layer 5), and it is preferred that the metal electrode 2 have a thickness of 0.3 mm or more. In general, the thickness of the metal electrode 2 is 1 mm or less.

Examples of the semiconductor element 3 include a diode, a metal oxide semiconductor field-effect-transistor (MOSFET), an insulated gate bipolar transistor (IGBT), and a thyristor. In the semiconductor device according to the first embodiment, a semiconductor element that uses a material having a wide bandgap as compared to that of silicon (Si), for example, a wide bandgap semiconductor material such as a silicon carbide (SiC)-based material, a gallium nitride (GaN)-based material, or diamond is suitable because its performance is exhibited under a high-temperature operation environment.

The metallization layer 4 may be made of Au, Ag, Cu, Ni, Ti, Co, Pd, Pt, or an alloy containing any of these metals as a main component. In general, the metallization layer 4 has a thickness of 1 nm or more and 500 nm or less.

The metal nanoparticle sintered layer 5 is formed by applying, onto the metal electrode 2 or the metallization layer 4, a paste containing organic material-coated metal nanoparticles and a solvent to form a metal nanoparticle layer, and sintering the metal nanoparticle layer. The organic material-coated metal nanoparticles are obtained by coating each surface of nanoparticles of Au, Ag, Cu, Ni, or an alloy containing any of these metals as a main component with, for example, a hydrocarbon-based, an amine-based, or an alcohol-based organic protective material. Specifically, the metal nanoparticle sintered layer 5 may be obtained by sintering the metal nanoparticle layer by heating at a temperature of 200° C. or more and 350° C. or less for 30 seconds or more and 30 minutes or less under a pressure of 0.1 MPa or more and 50 MPa or less. In consideration of actual mass production, it is desired that the heating time be 10 minutes or less. The thickness of the metal nanoparticle sintered layer 5 is generally 0.01 mm or more and 0.2 mm or less. As the metal nanoparticles, Ag nanoparticles and Ag alloy nanoparticles are preferred from the viewpoints of chemical stability and easy handling. Examples of the solvent to be used for forming the paste include an alcohol, such as propanol, benzene, acetone, toluene, xylene, ether, and petroleum ether. There is no particular limitation on a method of applying the paste, but there are given, for example, screen printing and dispenser application.

Figure 2:
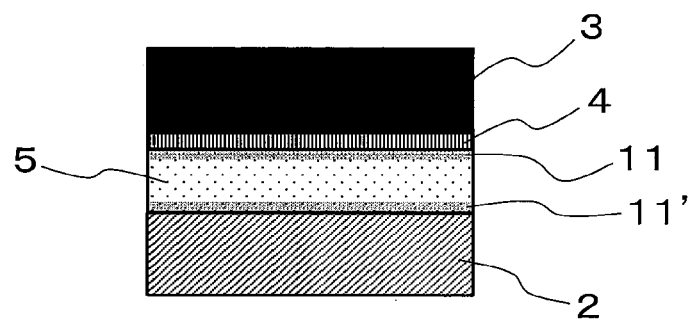
FIG. 2 is a partially enlarged sectional view of a vicinity of a metal nanoparticle sintered layer in the semiconductor device according to the first embodiment.
Figure 3:
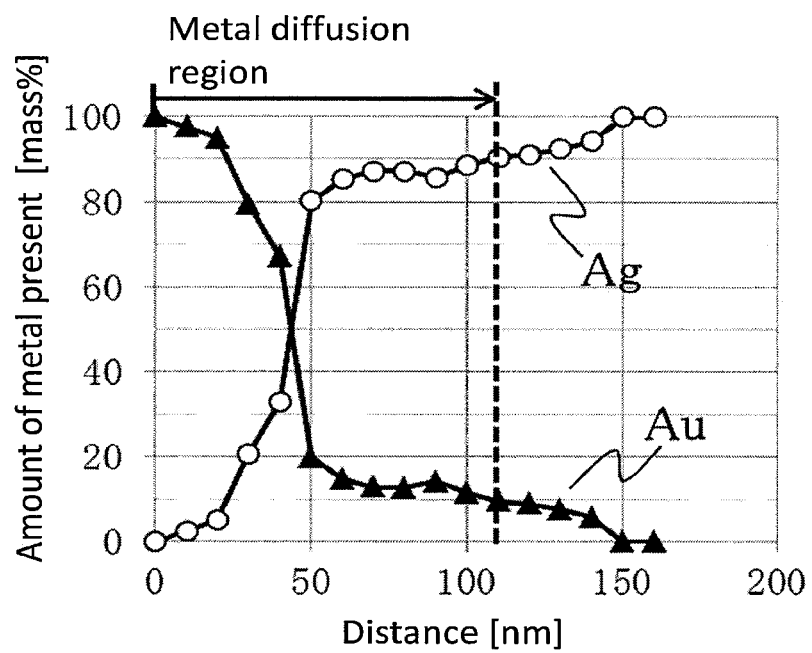
FIG. 3 is a graph for showing TEM-EDS analysis results of the metal nanoparticle sintered layer in the semiconductor device according to the first embodiment.

FIG. 2 is a partially enlarged sectional view of a vicinity of the metal nanoparticle sintered layer 5 in the semiconductor device according to the first embodiment. As illustrated in FIG. 2, a metal diffusion region 11 is formed to a predetermined thickness on a side in contact with the metallization layer 4 of the metal nanoparticle sintered layer 5. In the metal diffusion region 11, a metal constituting the metallization layer 4 is diffused by heating during sintering. In addition, a metal diffusion region 11' is formed on a side in contact with the metal electrode 2 of the metal nanoparticle sintered layer 5. In the metal diffusion region 11', a metal constituting the metal electrode 2 is diffused by heating during sintering. When the metal diffusion region 11 is defined as a region in which the metal constituting the metallization layer 4 is present in an amount of 10 mass % or more and less than 100 mass % according to TEM-EDS analysis, the thickness of the metal diffusion region 11 is set to be smaller than that of the metallization layer 4 in the semiconductor device according to the first embodiment. When the thickness of the metal diffusion region 11 is set to be smaller than that of the metallization layer 4 as described above, it is possible to obtain a semiconductor device in which the propagation of cracks in a horizontal direction can be suppressed even when thermal shock is repeatedly applied to the semiconductor device, and which has high joint reliability. In addition, the thickness of the metal diffusion region 11' is 1 nm or more and less than 100 nm. The thickness of each of the metal diffusion region 11 and the metal diffusion region 11' may be controlled by changing the pressure, heating temperature, and heating time (joining time) during sintering of the metal nanoparticle layer. FIG. 3 is a graph for showing results obtained by analyzing the diffused state of Au in the metal nanoparticle sintered layer 5 by TEM-EDS in the case of forming the metal nanoparticle sintered layer 5 to a thickness of 0.05 mm through use of Ag nanoparticles under the conditions that the metallization layer 4 is a layer made of Au having a thickness of 200 nm, and the pressure, heating temperature, and heating time during sintering of the metal nanoparticle layer are set to 5 MPa, 300° C., and 5 minutes, respectively. In this case, the thickness of the metal diffusion region 11 can be determined to be 110 nm from the TEM-EDS analysis results. From the viewpoint of further suppressing the propagation of cracks in the horizontal direction, it is preferred that the thickness of the metal diffusion region 11 be 1 nm or more and less than 100 nm.

In addition, when the thickness of the metallization layer 4 formed on the surface of the semiconductor element 3 is small, specifically, when the thickness is less than 100 nm, it is preferred that the thickness of the metal diffusion region 11 be controlled by adopting configurations according to a second embodiment to a fourth embodiment described later, as well as changing the pressure, heating temperature, and heating time (joining time) during sintering of the metal nanoparticle layer.

In the first embodiment, the description has been given of the example of the semiconductor device in which the metal electrode 2 formed on the surface of the circuit board 1 and the metallization layer 4 formed on the surface of the semiconductor element 3 are electrically joined to each other via the metal nanoparticle sintered layer 5. However, the present invention is not limited thereto as long as the semiconductor device has a configuration in which the electronic components are electrically joined to each other via the metal nanoparticle sintered layer 5.

Second Embodiment

A semiconductor device according to a second embodiment of the present invention is different from that according to the first embodiment in a method of controlling the thickness of the metal diffusion region 11. Specifically, in the second embodiment, the thickness of the metal diffusion region 11 is controlled by subjecting the metallization layer 4 to oxygen plasma treatment or nitrogen plasma treatment in advance before the paste described in the first embodiment is applied onto the metallization layer 4.

Figure 4:
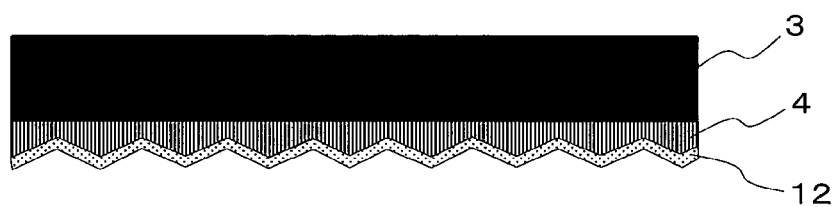
FIG. 4 is a schematic sectional view of a semiconductor element having a metallization layer after plasma treatment according to a second embodiment of the present invention.

The oxygen plasma treatment or the nitrogen plasma treatment may be performed by exposing the metallization layer 4 to an $O_2$ plasma atmosphere, a $N_2$ plasma atmosphere, or a plasma atmosphere of a mixed gas thereof. A $N_2$ plasma etches an outermost surface to expose an active surface, and forms a thin metal oxide film under a room temperature environment in the atmosphere. Meanwhile, an $O_2$ plasma etches an outermost surface to expose an active surface and simultaneously forms a thin metal oxide film on the outermost surface. The plasma of a mixed gas of $N_2$ and $O_2$ exhibits the performance of each gas. It is only required that a plasma generation device in this case have a frequency of 100 kHz or more and 2.45 GHz or less. However, in order to suppress damage to the semiconductor element 3, it is preferred that the plasma treatment be performed in a high-frequency band of 13.56 MHz or more. The thin metal oxide film formed on the outermost surface has a thickness of from about 1 nm to about 100 nm. FIG. 4 is a schematic sectional view of the semiconductor element 3 having the metallization layer 4 after the plasma treatment. When the thin metal oxide film 12 is formed by the plasma treatment, the following process is employed: the thin metal oxide film 12 is removed and then joining is performed during sintering of the metal nanoparticle layer. Therefore, a long heating time (sintering time) is required by the time when the metal diffusion region 11 is formed (by the time when the metal constituting the metallization layer 4 is diffused into the metal nanoparticle sintered layer 5). Therefore, the growth of the metal diffusion region 11 (increase in thickness of the metal diffusion region 11) is suppressed. Further, minute irregularities each having a size of 1 μm or less are formed on the surface of the metallization layer 4 after the plasma treatment. The minute irregularities serve as a barrier to the propagation of cracks in the horizontal direction at an interface with the semiconductor element 3. Therefore, the propagation of cracks in the horizontal direction is suppressed as compared to the case of the flat metallization layer 4 that has not been subjected to the plasma treatment.

The other configurations are the same as those of the first embodiment, and hence description thereof is omitted.

Third Embodiment

A semiconductor device according to a third embodiment of the present invention is different from that according to the first embodiment in a method of controlling the thickness of the metal diffusion region 11. Specifically, in the third embodiment, the thickness of the metal diffusion region 11 is controlled by applying a hydrocarbon-based solvent or an alcohol-based solvent having a boiling point of 100° C. or more and 350° C. or less to the metal nanoparticle layer before being sintered described in the first embodiment.

As described in the first embodiment, each surface of the metal nanoparticles to be used for forming the metal nanoparticle layer is coated with the organic protective material. In general, the organic coating is designed to be burnt at a temperature of 100° C. or more, and a sintering reaction of the metal nanoparticles is started simultaneously with the burning of the organic coating. Therefore, when an organic solvent having a boiling point equal to or more than the temperature at which the burning of the organic coating is started is applied (dropped) to the metal nanoparticle layer before being sintered, the organic solvent is vaporized simultaneously with or slightly behind the start of the sintering of the metal nanoparticles, and active surfaces of the metallization layer 4 and the metal electrode 2 are formed at interfaces with the metal nanoparticle sintered layer 5 in association with the vaporization. The organic solvent suppresses the growth of the metal diffusion region 11 (increase in thickness of the metal diffusion region 11) until the organic solvent reaches the boiling point, and hence the thickness of the metal diffusion region 11 is controlled.

The organic solvent to be used is preferably a hydrocarbon-based solvent or an alcohol-based solvent having a boiling point of 80° C. or more and 350° C. or less. Specific examples of such organic solvent include alkanes, such as heptane ($C_7H_{16}$, boiling point: 98° C.), octane ($C_8H_{18}$, boiling point: 126° C.), nonane ($C_9H_{20}$, boiling point: 151° C.), decane ($C_{10}H_{22}$, boiling point: 174° C.), undecane ($C_{11}H_{24}$, boiling point: 196° C.), dodecane ($C_{12}H_{26}$, boiling point: 216° C.), tridecane ($C_{13}H_{28}$, boiling point: 230° C.), tetradecane ($C_{14}H_{30}$, boiling point: 251° C.), pentadecane ($C_{15}H_{32}$, boiling point: 268° C.), hexadecane ($C_{16}H_{34}$, boiling point: 280° C.), and heptadecane ($C_{17}H_{36}$, boiling point: 303° C.), and alcohols each obtained by substituting one hydrogen of these alkanes with one hydroxyl group (—OH). Those organic solvents may be used alone or as a mixture thereof. When any of those organic solvents is vaporized, the organic solvent may adhere to the periphery of the circuit board 1, but can be easily removed with a cleaning agent. The cleaning agent may be any of acid, neutral, and alkaline agents, but a neutral (pH value of from 6 to 9) cleaning agent is preferred in consideration of the influence on the semiconductor element 3.

The other configurations are the same as those of the first embodiment, and hence description thereof is omitted.

Fourth Embodiment

A semiconductor device according to a fourth embodiment of the present invention is different from that according to the first embodiment in a method of controlling the thickness of the metal diffusion region 11. Specifically, in the fourth embodiment, the thickness of the metal diffusion region 11 is controlled by forming the metallization layer 4 using a metal that is less likely to be mutually diffused with the metal of the metal nanoparticle sintered layer 5.

Figure 5:
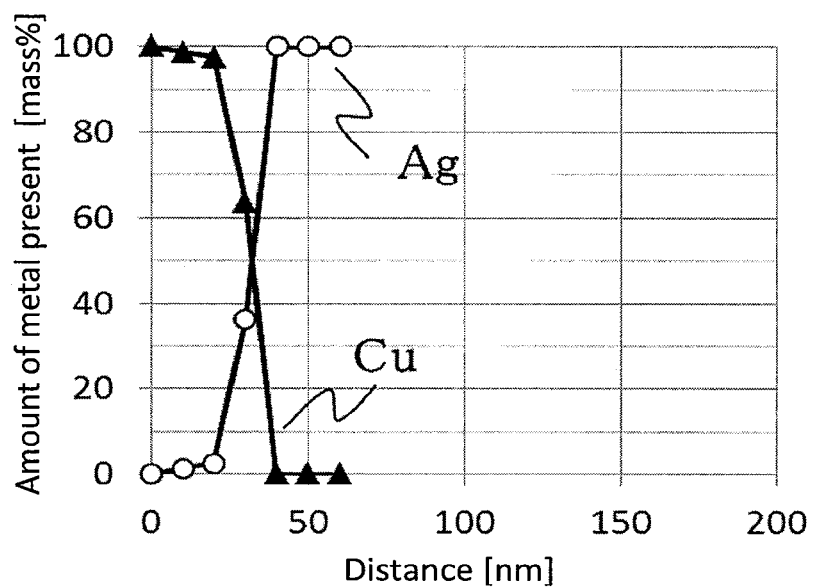
FIG. 5 is a graph for showing TEM-EDS analysis results of a metal nanoparticle sintered layer in a semiconductor device according to a fourth embodiment of the present invention.

Metals of different kinds have different atomic radii, and hence there are a metal that is likely to be diffused into a base metal and a metal that is less likely to be diffused thereinto. For example, when the metal nanoparticle sintered layer 5 is formed by using Ag nanoparticles or Ag alloy nanoparticles as metal nanoparticles, it is preferred that the metallization layer 4 be formed by using Cu, Ni, Ti, Co, Pd, Pt, or an alloy thereof, which is less likely to be mutually diffused with Ag or a Ag alloy. When the metallization layer 4 is formed by using such metal, the metal constituting the metallization layer 4 is less likely to be diffused into the metal nanoparticle sintered layer 5, and hence the growth of the metal diffusion region 11 (increase in thickness of the metal diffusion region 11) is suppressed. FIG. 5 is a graph for showing results obtained by analyzing the diffused state of Cu in the metal nanoparticle sintered layer 5 by TEM-EDS in the case of forming the metal nanoparticle sintered layer 5 having a thickness of 0.05 mm using Ag nanoparticles under the conditions that the metallization layer 4 is a layer made of Cu having a thickness of 200 nm, and the pressure, heating temperature, and heating time during sintering of the metal nanoparticle layer are set to 5 MPa, 300° C., and 30 minutes, respectively. As described above, Ag and Cu are metals that are less likely to be mutually diffused, and hence the thickness of the metal diffusion region 11 can be controlled to less than 100 nm.

The other configurations are the same as those of the first embodiment, and hence description thereof is omitted.

EXAMPLES

Example 1

A Ag nanoparticle layer formed between a metal electrode made of Cu having a thickness of 0.3 mm formed on a surface of a circuit board and a metallization layer made of Au having a thickness of 100 nm formed on a surface of a semiconductor element was heated at 250° C. for 5 minutes under a pressure of 5 MPa, to thereby produce a semiconductor device in which the metal electrode and the metallization layer were electrically joined to each other via a Ag nanoparticle sintered layer having a thickness of 0.05 mm. The diffused state of Au in the Ag nanoparticle sintered layer was analyzed by TEM-EDS, and as a result, it was found that the thickness of the metal diffusion region was 80 nm.

Example 2

A semiconductor device was produced in the same manner as in Example 1 except that the Ag nanoparticle layer was heated at 200° C. for 5 minutes under a pressure of 5 MPa. The diffused state of Au in the Ag nanoparticle sintered layer was analyzed by TEM-EDS, and as a result, it was found that the thickness of the metal diffusion region was 40 nm.

Example 3

A semiconductor device was produced in the same manner as in Example 1 except that the thickness of the metallization layer was changed to 50 nm and the Ag nanoparticle layer was heated at 200° C. for 5 minutes under a pressure of 5 MPa. The diffused state of Au in the Ag nanoparticle sintered layer was analyzed by TEM-EDS, and as a result, it was found that the thickness of the metal diffusion region was 40 nm.

Example 4

A semiconductor device was produced in the same manner as in Example 1 except that the Ag nanoparticle layer was heated at 200° C. for 2 minutes under a pressure of 5 MPa. The diffused state of Au in the Ag nanoparticle sintered layer was analyzed by TEM-EDS, and as a result, it was found that the thickness of the metal diffusion region was 20 nm.

Example 5

A semiconductor device was produced in the same manner as in Example 1 except that the Ag nanoparticle layer was heated at 200° C. for 30 seconds under a pressure of 5 MPa. The diffused state of Au in the Ag nanoparticle sintered layer was analyzed by TEM-EDS, and as a result, it was found that the thickness of the metal diffusion region was 10 nm.

Example 6

A semiconductor device was produced in the same manner as in Example 1 except that the Ag nanoparticle layer was heated at 180° C. for 30 seconds under a pressure of 5 MPa. The diffused state of Au in the Ag nanoparticle sintered layer was analyzed by TEM-EDS, and as a result, it was found that the thickness of the metal diffusion region was 1 nm.

Example 7

A semiconductor device was produced in the same manner as in Example 1 except that the thickness of the metallization layer was changed to 50 nm and the Ag nanoparticle layer was heated at 200° C. for 2 minutes under a pressure of 5 MPa. The diffused state of Au in the Ag nanoparticle sintered layer was analyzed by TEM-EDS, and as a result, it was found that the thickness of the metal diffusion region was 20 nm.

Example 8

A semiconductor device was produced in the same manner as in Example 1 except that the thickness of the metallization layer was changed to 50 nm and the Ag nanoparticle layer was heated at 200° C. for 30 seconds under a pressure of 5 MPa. The diffused state of Au in the Ag nanoparticle sintered layer was analyzed by TEM-EDS, and as a result, it was found that the thickness of the metal diffusion region was 10 nm.

Example 9

A semiconductor device was produced in the same manner as in Example 1 except that the thickness of the metallization layer was changed to 50 nm and the Ag nanoparticle layer was heated at 180° C. for 30 seconds under a pressure of 5 MPa. The diffused state of Au in the Ag nanoparticle sintered layer was analyzed by TEM-EDS, and as a result, it was found that the thickness of the metal diffusion region was 1 nm.

Comparative Example 1

A semiconductor device was produced in the same manner as in Example 1 except that the Ag nanoparticle layer was heated at 300° C. for 30 minutes under a pressure of 5 MPa. The diffused state of Au in the Ag nanoparticle sintered layer was analyzed by TEM-EDS, and as a result, it was found that the thickness of the metal diffusion region was 120 nm.

Comparative Example 2

A semiconductor device was produced in the same manner as in Example 1 except that the thickness of the metallization layer was changed to 50 nm and the Ag nanoparticle layer was heated at 300° C. for 30 minutes under a pressure of 5 MPa. The diffused state of Au in the Ag nanoparticle sintered layer was analyzed by TEM-EDS, and as a result, it was found that the thickness of the metal diffusion region was 120 nm.

Comparative Example 3

A semiconductor device was produced in the same manner as in Example 1 except that the Ag nanoparticle layer was heated at 300° C. for 20 seconds under a pressure of 5 MPa. The diffused state of Au in the Ag nanoparticle sintered layer was analyzed by TEM-EDS, and as a result, it was found that the thickness of the metal diffusion region was 100 nm.

Comparative Example 4

A semiconductor device was produced in the same manner as in Example 1 except that the thickness of the metallization layer was changed to 50 nm. The diffused state of Au in the Ag nanoparticle sintered layer was analyzed by TEM-EDS, and as a result, it was found that the thickness of the metal diffusion region was 50 nm.

Figure 6:
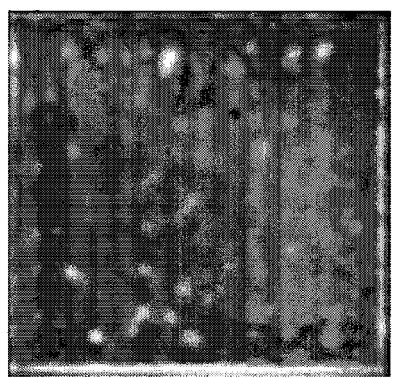
FIG. 6 is an ultrasonic testing image of an interface between a metallization layer and a Ag nanoparticle sintered layer in a semiconductor device of Example 1 after a thermal shock test.
Figure 7:
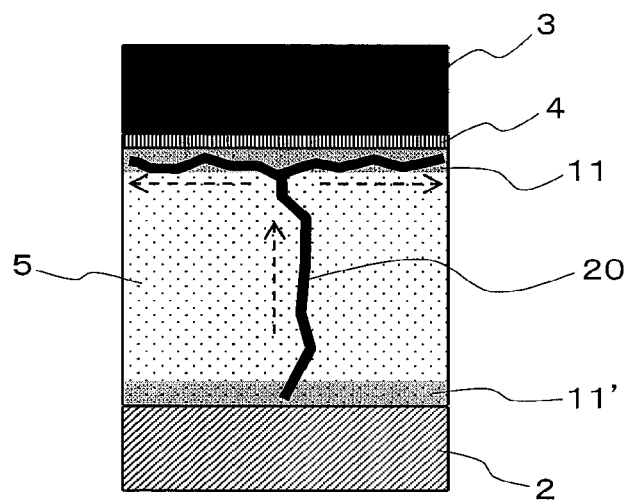
FIG. 7 is a view for schematically illustrating the generation status of a crack in the metal nanoparticle sintered layer after the thermal shock test.
Figure 8:
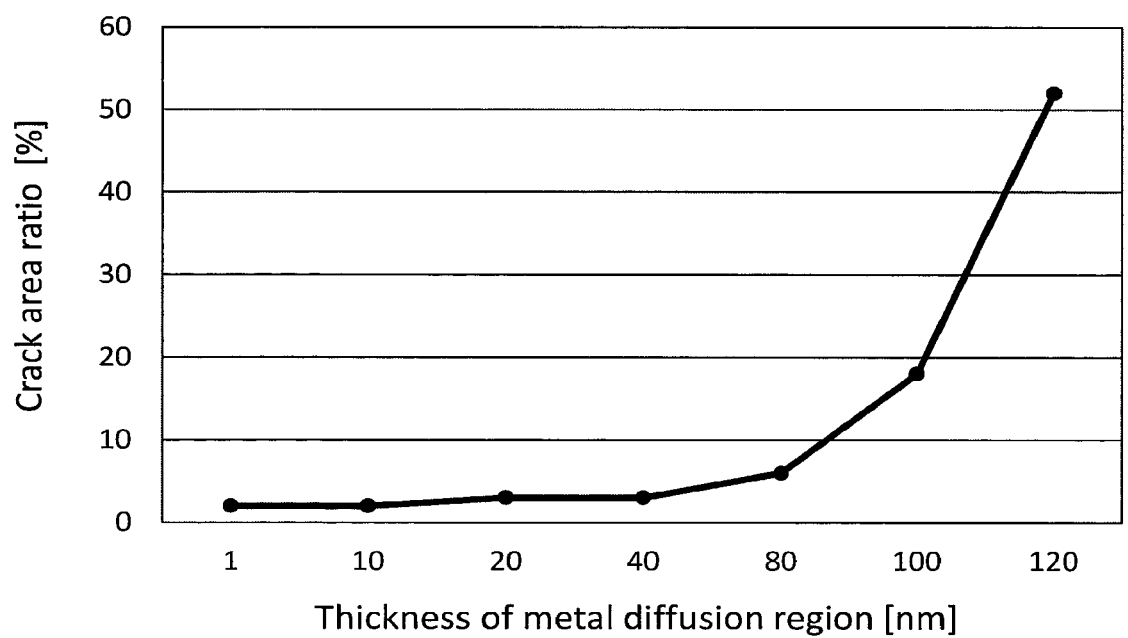
FIG. 8 is a graph for showing a relationship between the thickness of a metal diffusion region and a crack area ratio in a semiconductor device (thickness of a metallization layer: 100 nm) produced in each of Examples and Comparative Examples.
Figure 9:
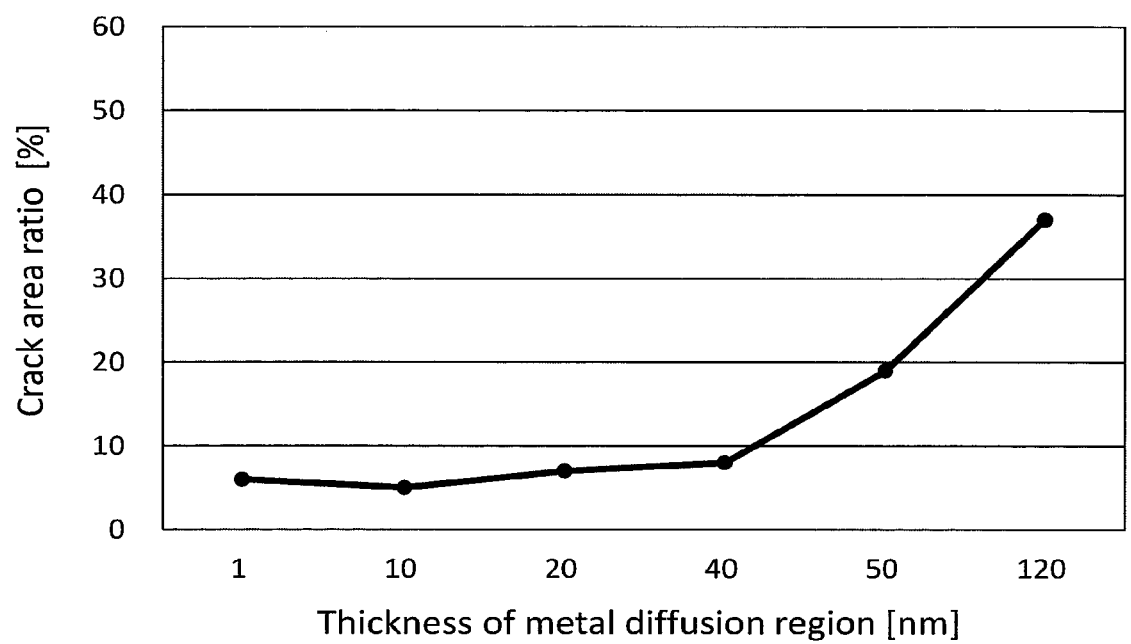
FIG. 9 is a graph for showing a relationship between the thickness of a metal diffusion region and a crack area ratio in a semiconductor device (thickness of a metallization layer: 50 nm) produced in each of Examples and Comparative Examples.

Each of the semiconductor devices produced as described above was subjected to a thermal shock test at a temperature of from −55° C. to 175° C. (one cycle: kept at −55° C. for 15 minutes/kept at 175° C. for 15 minutes). In FIG. 6, there is shown a result obtained by observing an interface between the metallization layer and the Ag nanoparticle sintered layer in the semiconductor device of Example 1 after the thermal shock test of 600 cycles from an upper surface side of the semiconductor element 3 by non-destructive ultrasonic testing. FIG. 7 is a view for schematically illustrating the generation status of a crack in the metal nanoparticle sintered layer after the thermal shock test. In the ultrasonic testing image, sensitivity to a crack in a plane of the semiconductor element, that is, a crack in the horizontal direction is satisfactory. Thus, it can be considered that a dark portion of FIG. 6 represents a joint portion, and a white portion of FIG. 6 represents a portion in which a crack 20 in the horizontal direction occurs in the metal diffusion region 11 as illustrated in FIG. 7. Through use of this procedure, the status of the propagation of cracks in the horizontal direction can be determined as an area ratio in a non-destructive manner. In each of the semiconductor devices after the thermal shock test, an area ratio of the white portion as illustrated in FIG. 6 with respect to the entirety was calculated as a crack area ratio. In addition, a thermal resistance of each of the semiconductor devices after the thermal shock test was measured. The case in which an increase in temperature was not recognized was evaluated to be satisfactory (○) in joint reliability, and the case in which an increase in temperature was recognized was evaluated to be unsatisfactory (×) in joint reliability. Those results are shown in Table 1. In addition, of the results shown in Table 1, the relationship between the thickness of the metal diffusion region and the crack area ratio in the semiconductor device in which the metallization layer has a thickness of 100 nm is shown in FIG. 8, and the relationship between the thickness of the metal diffusion region and the crack area ratio in the semiconductor device in which the metallization layer has a thickness of 50 nm is shown in FIG. 9.

TABLE 1

| | Thickness of metallization layer | Thickness of metal diffusion region | Crack area ratio | Joint reliability |
|---|---|---|---|---|
| Example 1 | 100 nm | 80 nm | 6% | ○ |
| Example 2 | 100 nm | 40 nm | 3% | ○ |
| Example 3 | 50 nm | 40 nm | 8% | ○ |
| Example 4 | 100 nm | 20 nm | 3% | ○ |
| Example 5 | 100 nm | 10 nm | 2% | ○ |
| Example 6 | 100 nm | 1 nm | 2% | ○ |
| Example 7 | 50 nm | 20 nm | 7% | ○ |
| Example 8 | 50 nm | 10 nm | 5% | ○ |

TABLE 1-continued

| | Thickness of metallization layer | Thickness of metal diffusion region | Crack area ratio | Joint reliability |
|---|---|---|---|---|
| Example 9 | 50 nm | 1 nm | 6% | ○ |
| Comparative Example 1 | 100 nm | 120 nm | 52% | x |
| Comparative Example 2 | 50 nm | 120 nm | 37% | x |
| Comparative Example 3 | 100 nm | 100 nm | 18% | x |
| Comparative Example 4 | 50 nm | 50 nm | 19% | x |

As is understood from Table 1, in each of the semiconductor devices of Comparative Example 1 to Comparative Example 4, the thickness of the metal diffusion region was larger than that of the metallization layer, or the thickness of the metal diffusion region was equal to that of the metallization layer. Therefore, the crack area ratio was 18% or more, and the joint reliability was also unsatisfactory. In each of the semiconductor devices of Example 1 to Example 9, the thickness of the metal diffusion region was smaller than that of the metallization layer. Therefore, the crack area ratio was less than 10%, and the joint reliability was also satisfactory.

Example 10

A Ag nanoparticle layer formed between a metal electrode made of Cu having a thickness of 0.3 mm formed on a surface of a circuit board and a metallization layer made of Cu having a thickness of 200 nm formed on a surface of a semiconductor element was heated at 300° C. for 5 minutes under a pressure of 5 MPa, to thereby produce a semiconductor device in which the metal electrode and the metallization layer were electrically joined to each other via a Ag nanoparticle sintered layer having a thickness of 0.05 mm. The diffused state of Cu in the Ag nanoparticle sintered layer was analyzed by TEM-EDS, and as a result, it was found that the thickness of the metal diffusion region was 10 nm.

Example 11

A Ag nanoparticle layer formed between a metal electrode made of Cu having a thickness of 0.3 mm formed on a surface of a circuit board and a metallization layer made of Ni having a thickness of 200 nm formed on a surface of a semiconductor element was heated at 300° C. for 5 minutes under a pressure of 5 MPa, to thereby produce a semiconductor device in which the metal electrode and the metallization layer were electrically joined to each other via a Ag nanoparticle sintered layer having a thickness of 0.05 mm. The diffused state of Ni in the Ag nanoparticle sintered layer was analyzed by TEM-EDS, and as a result, it was found that the thickness of the metal diffusion region was 10 nm.

Example 12

A Ag nanoparticle layer formed between a metal electrode made of Cu having a thickness of 0.3 mm formed on a surface of a circuit board and a metallization layer made of Ti having a thickness of 200 nm formed on a surface of a semiconductor element was heated at 300° C. for 5 minutes under a pressure of 5 MPa, to thereby produce a semiconductor device in which the metal electrode and the metallization layer were electrically joined to each other via a Ag nanoparticle sintered layer having a thickness of 0.05 mm. The diffused state of Ti in the Ag nanoparticle sintered layer was analyzed by TEM-EDS, and as a result, it was found that the thickness of the metal diffusion region was 10 nm.

In each of the semiconductor devices after the thermal shock test, a crack area ratio was determined, and joint reliability was evaluated in the same manner as in Example 1. The results are shown in Table 2.

TABLE 2

| | Thickness of metallization layer | Thickness of metal diffusion region | Crack area ratio | Joint reliability |
|---|---|---|---|---|
| Example 10 | Cu: 200 nm | 10 nm | 5% | ○ |
| Example 11 | Ni: 200 nm | 10 nm | 8% | ○ |
| Example 12 | Ti: 200 nm | 10 nm | 7% | ○ |

As is understood from Table 2, in each of the semiconductor devices of Example 10, Example 11, and Example 12, the thickness of the metal diffusion region was less than 30 nm, which was smaller that that of the metallization layer. Therefore, the crack area ratio was less than 10%, and the joint reliability was also satisfactory.

The present international application claims priority based on Japanese Patent Application No. 2017-059464 filed on Mar. 24, 2017, the contents of which are incorporated herein by reference in their entirety.

EXPLANATION ON NUMERALS 1 circuit board, 2 metal electrode, 3 semiconductor element, 4 metallization layer, 5 metal nanoparticle sintered layer, 11 metal diffusion region, 11' metal diffusion region, 12 thin metal oxide film, 20 crack

The invention claimed is:

1. A semiconductor device, comprising electronic components electrically joined to each other via a metal nanoparticle sintered layer,
   wherein the metal nanoparticle sintered layer has formed therein a metal diffusion region in which a metal constituting a metallization layer formed on a surface of one of the electronic components is diffused, and in which the metal is present in an amount of 10 mass % or more and less than 100 mass % according to TEM-EDS analysis, and
   wherein the metal diffusion region has a thickness smaller than a thickness of the metallization layer,
   wherein the metal nanoparticle sintered layer is only composed of a layer formed by applying a paste containing organic material-coated Ag nanoparticles to form a Ag nanoparticle layer, and sintering the Ag nanoparticle layer, and
   wherein the metallization layer includes Au, Cu, Ni, or Ti as a main component.

2. The semiconductor device according to claim 1, wherein the metal diffusion region has a thickness of 1 nm or more and less than 100 nm.

3. The semiconductor device according to claim 1, wherein a surface of the metallization layer includes a pattern of irregularities each having a size of 1 or less.

4. The semiconductor device according to claim 1, wherein the metallization layer consists of Au, Cu, Ni, or Ti.

* * * * *

UNITED STATES PATENT AND TRADEMARK OFFICE
CERTIFICATE OF CORRECTION

| | |
|---|---|
| PATENT NO. | : 11,569,169 B2 |
| APPLICATION NO. | : 16/485552 |
| DATED | : January 31, 2023 |
| INVENTOR(S) | : Tsuyoshi Tanigaki |

It is certified that error appears in the above-identified patent and that said Letters Patent is hereby corrected as shown below:

In the Claims

Column 12, Line 62, should be changed "pattern of irregularities each having a size of 1 or less." to
-- pattern of irregularities each having a size of 1 μm or less. --

Signed and Sealed this
Eleventh Day of April, 2023

Katherine Kelly Vidal
*Director of the United States Patent and Trademark Office*